United States Patent [19]

Tran et al.

[11] Patent Number: 4,658,382
[45] Date of Patent: Apr. 14, 1987

[54] DYNAMIC MEMORY WITH IMPROVED DUMMY CELL CIRCUITRY

[75] Inventors: Bao G. Tran; Hugh P. McAdams, both of Houston; Jimmie D. Childers, Missouri City, all of Tex.

[73] Assignee: Texas Instruments Incorporated, Dallas, Tex.

[21] Appl. No.: 630,507

[22] Filed: Jul. 11, 1984

[51] Int. Cl.[4] .................... G11C 11/40; G11C 13/00
[52] U.S. Cl. .................... 365/203; 365/149; 365/204; 365/210
[58] Field of Search ............... 365/203, 204, 149, 210, 365/205

[56] References Cited

U.S. PATENT DOCUMENTS

| | | | |
|---|---|---|---|
| 3,760,381 | 9/1973 | Yao | 365/205 |
| 3,909,631 | 9/1975 | Kitagawa | 365/203 |
| 3,942,160 | 3/1976 | Yu | 365/204 |
| 4,363,111 | 12/1982 | Heightley et al. | 365/210 |
| 4,370,575 | 1/1983 | McAlexander, III et al. | 365/203 |
| 4,458,336 | 7/1984 | Takemae | 365/203 |
| 4,506,351 | 3/1985 | Scheuerlein et al. | 365/149 |

FOREIGN PATENT DOCUMENTS 0030193 2/1982 Japan .................... 365/203

Primary Examiner—Terrell W. Fears
Attorney, Agent, or Firm—John G. Graham

[57] ABSTRACT

A semiconductor read/write memory device of the type using dynamic one-transistor storage cells employs dummy capacitors which are the same size as the storage capacitors, and these dummy capacitors are precharged to a reference voltage level less than half the supply voltage. A voltage divider sets the precharge level, but this divider is shunted by a control device initially so the dummy capacitors are quickly discharged to the reference level. A comparator with differential inputs determines when the reference level has reached the proper value, then the control device and the comparator are shut off to reduce power, and the reference level maintained by the voltage divider. The dummy capacitor precharge starts during the later part of an active cycle, so the specified cycle time can be minimized.

18 Claims, 7 Drawing Figures

DYNAMIC MEMORY WITH IMPROVED DUMMY CELL CIRCUITRY

RELATED CASES

This application discloses subject matter also disclosed in copending applications Ser. No. 626,791, filed July 2, 1984; Ser. No. 634,898, filed July 26, 1984; Ser. No. 634,901, filed July 26, 1984 and now U.S. Pat. No. 4,618,947; Ser. No. 636,941, filed Aug. 2, 1984; Ser. No. 640,716, filed Aug. 14, 1984; and Ser. No. 640,717, filed Aug. 14, 1984; all assigned to Texas Instruments.

BACKGROUND OF THE INVENTION

This invention relates to semiconductor memory devices, and more particularly to reference voltage generator circuits for precharging dummy cells in dynamic memory devices.

Dynamic MOS read/write memory devices have been constructed generally as shown in U.S. Pat. No. 4,081,701 (a 16K dynamic ROM) issued to White, McAdams and Redwine, or U.S. Pat. No. 4,239,993 (a 64K dynamic RAM) issued to McAlexander, White and Rao, both assigned to Texas Instruments.

In these prior devices a row of dummy cells on each side of the differential sense amplifiers was used as a reference input. The capacitors in the dummy cells were about one-half the size of the storage capacitors, and these dummy capacitors were predischarged to ground. Thus, the signal produced in the bit lines by the dummy cells was about half way between that produced by a one and that produced by a zero in the storage cell.

When the cell size is reduced to the level needed to manufacture high density memory devices of 256K-bit or 1-Megabit and beyond, the problem of forming the dummy capacitors at the proper ratio to the storage capacitors becomes formidable, from a process standpoint. Also, at these high densities, it becomes necessary to use a precharge level for the bit lines at one-half the supply level, instead of a full supply level; this is because half of the bit lines always are at the one level and half at zero level after every active cycle, and the bit lines can charge each other to the one-half level internal to the chip instead of charging all back up to the supply by externally-supplied current.

It is the principal object of this invention to provide improved circuitry for high density dynamic RAM devices, particularly for dummy cell precharging. Another object is to provide dummy cell precharging circuitry for a CMOS dynamic RAM in which the dummy cell capacitors are the same size as the storage capacitors. A further object is to provide dummy cell precharging circuitry which is of high speed and low power dissipation. An additional object is to provide dummy cell precharge to a reference level less than half the supply level, compensated for changes in the supply, in which the reference level can be readily changed

SUMMARY OF THE INVENTION

In accordance with one embodiment of the invention, a semiconductor read/write memory device of the type using dynamic one-transistor storage cells employs dummy capacitors which are the same size as the storage capacitors, and these dummy capacitors are precharged to a reference voltage level less than half the supply voltage. A voltage divider sets the precharge level, but this divider is shunted by a control device initially so the dummy capacitors are quickly discharged to the reference level. A comparator with differential inputs determines when the reference level has reached the proper value, then the control device and the comparator are shut off to reduce power, and the reference level maintained by the voltage divider. The dummy capacitor precharge starts during the later part of an active cycle, so that specified cycle time can be minimized.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
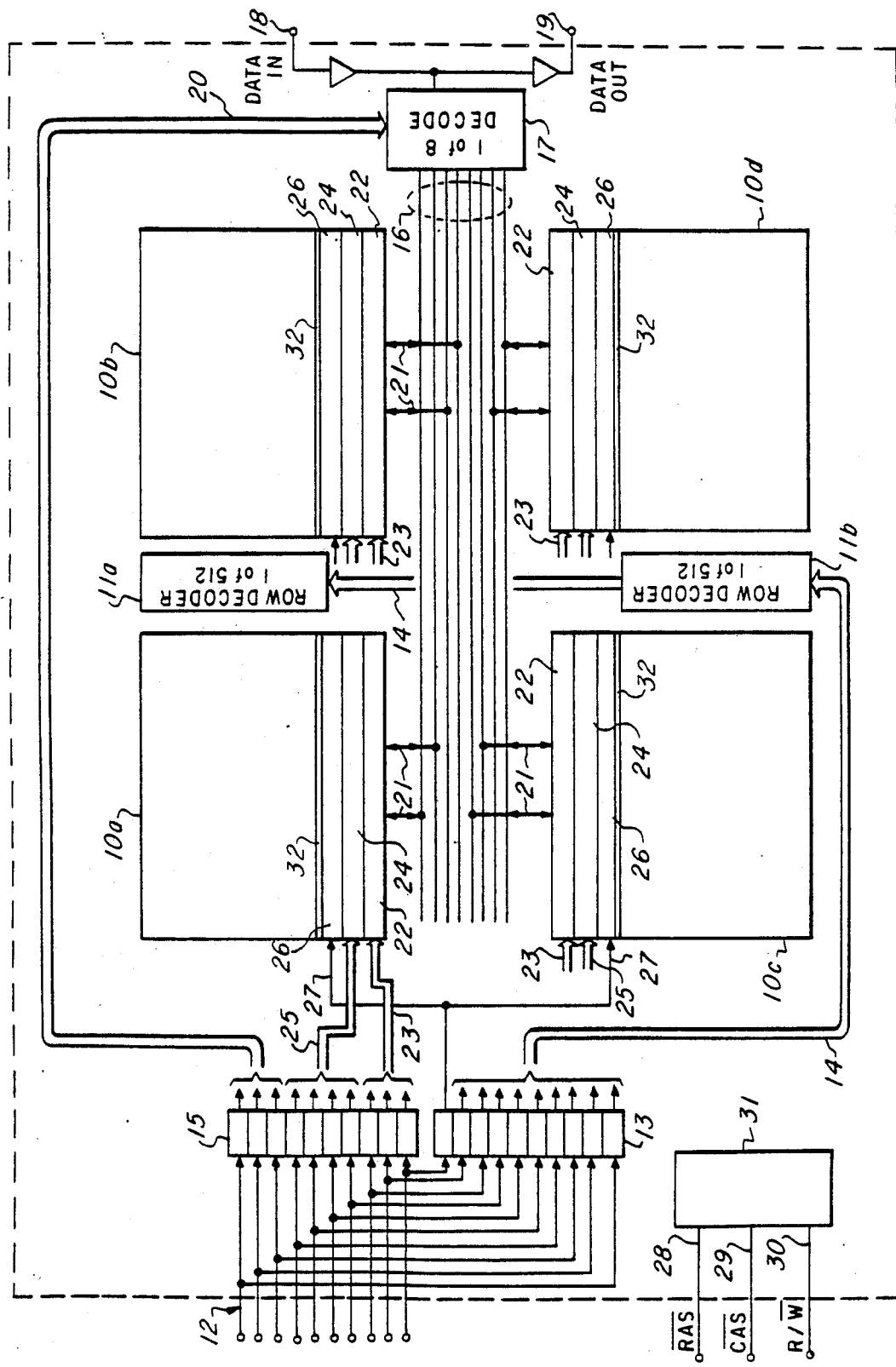
FIG. 1 is an electrical diagram in block form of a dynamic memory device of the 1-Megabit size which may use the dummy cell precharge circuitry of the invention.

Referring to FIG. 1, a block diagram of a semiconductor read/write memory chip which may use precharge generator circuitry constructed according to the invention is illustrated. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 and lines 14. A 10-bit column address is also applied to the input pins 12, in time-multiplexed manner, and this column address is applied to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in sixteen intermediate output buffers 22 for each block, using three bits of the column address on lines 23 from buffers 15. A 1-of-16 column selection is made in each of sixteen sets of sixteen intermediate output buffers 24 in each block 10a-10d, using four bits of the column address on lines 25 from buffers 15. Each one of 512 sense amplifiers 26 in each block is connected to one of the columns in the array (each column is made up of two column line halves or "bit lines"). Each buffer 24 is coupled to one of two columns; this selection is based on a one bit of the row address from buffers 13 on line 27. The memory device receives a row address strobe $\overline{RAS}$ on input pin 28, and a column address strobe $\overline{CAS}$ on input pin 29. Selection of a read or a write operation is made by a R/$\overline{W}$ control on an input pin 30. A clock generator and control circuit 31 produces all of the internal clocks and controls as needed.

Each block contains two rows of dummy cells 32 which in this device employ dummy cell capacitors of the same size as storage cell capacitors. The dummy cells receive a precharge voltage from a reference voltage generator 31a constructed according to the invention, as will be described below with reference to FIG. 7.

Figure 2:
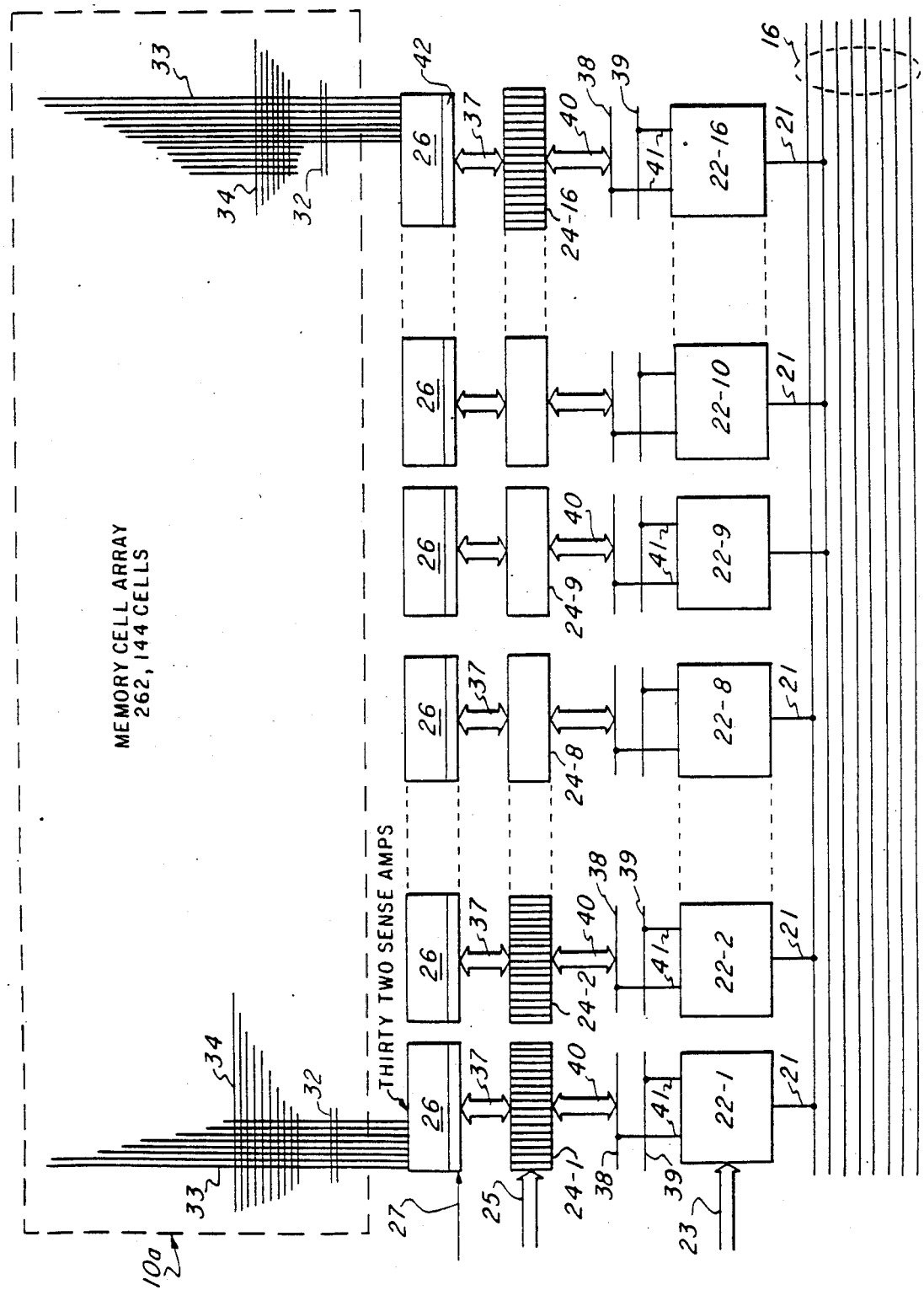
FIG. 2 is an electrical diagram in block form of a part of the memory device of FIG. 1.

Referring to FIG. 2, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the buffers 22-1 . . . 22-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33 (one column equals two bit lines, or two column line halves). Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from double rail at the lines 38 and 39 to single rail at the data I/O lines 16, for a write operation.

Figure 3:
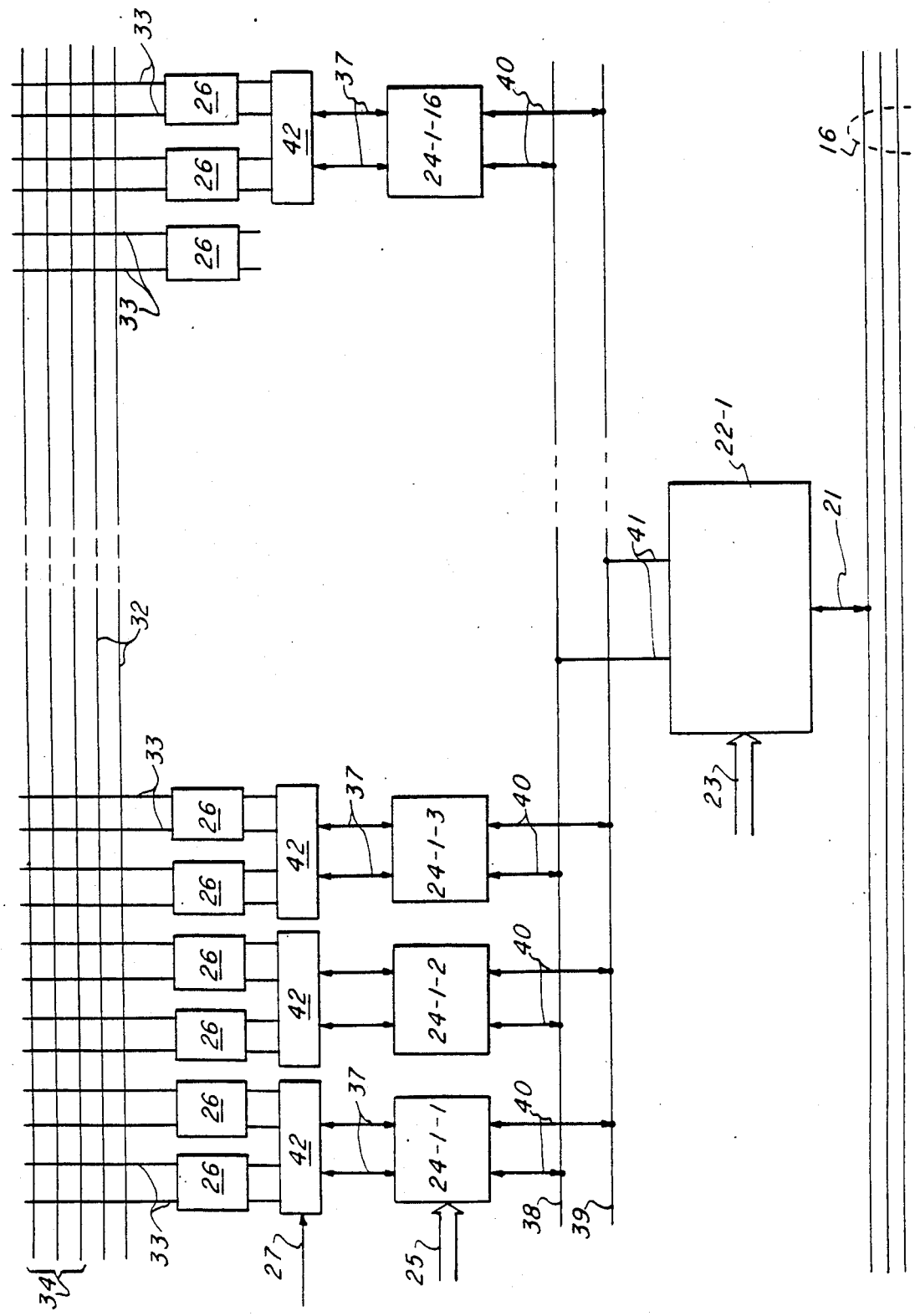
FIG. 3 is an electrical diagram in block form of a part of the circuitry of FIG. 2.

Referring to FIG. 3, a part of the circuitry of FIG. 2 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines 33 extending from it, in the so-called folded bit line configuration. Thus, both dummy rows 32 are on the same side of the sense amp. The row lines 34 intersect the bit lines, and memory cells are at intersections of row lines and bit lines. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operative to couple a read-or-write bit of data to or from the lines 38, 39 by lines 40. The buffer 22-1 of FIG. 3 may or may not be selected by the 2-of-16 select provided by three bits on lines 23, for coupling the dual-rail I/O lines 38, 39 to the single rail I/O line 16 for this group.

Figure 4:
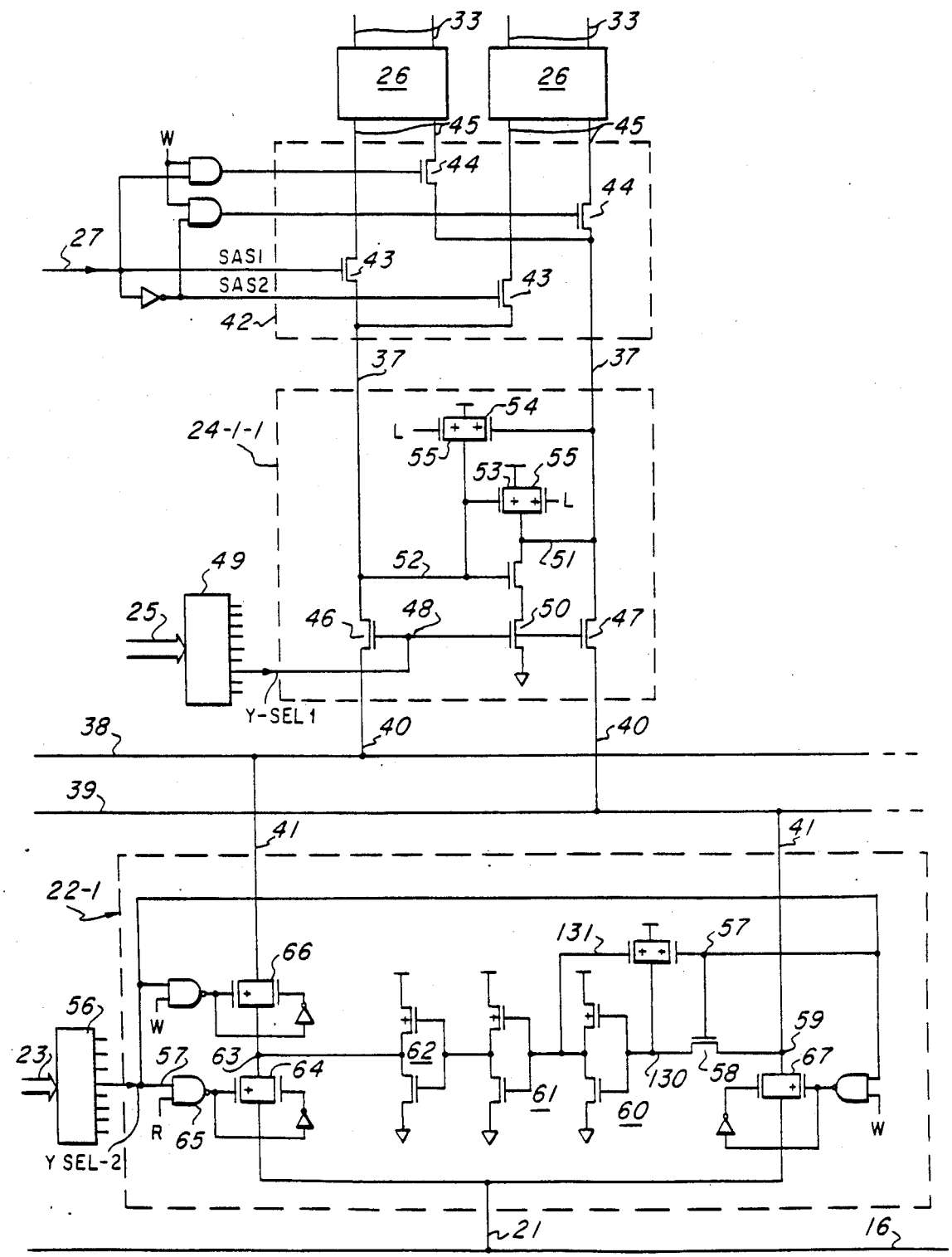
FIG. 4 is an electrical diagram in schematic form of the multiplexers, buffers and column selector circuits of the device of FIG. 3.

Turning now to FIG. 4, a detailed schematic diagram is shown for one of the buffers 24, e.g., the buffer 24-1-1 of FIG. 3, and for one of the buffers 22, e.g., the buffer 22-1. This arrangement of intermediate I/O buffers is the subject of copending application Ser. No. 626,791, filed July 2, 1984, by Poteet & Chang, assigned to Texas Instruments. The multiplexer 42 consists of four transistors; one of two transistors 43 is selected by the address bit on line 27 and its complement, i.e., by the sense-amp-select signals SAS1 and SAS2, so only one of these transistors 43 is on during a read (or write) operation. For read, only one path exists, through the selected one of the transistors 43. For write, one of the transistors 44 is also turned on by the address bit 27 which is Anded with a write control W from the control circuitry 31, valid when the R/$\overline{W}$ control 30 is in the write condition. Thus, the lines 45 which are inputs or outputs of the sense amplifiers 26 are single-ended for read and dual-rail for write; that is, for read operations both of the transistors 44 are off, and only one of the transistors 43 is on, whereas for write operations one transistor 43 and its associated transistor 44 are conductive. The input-/output lines 37 for the multiplexer 42 are connected through source/drain paths of transistors 46 and 47 in the buffer 24-1-1 to the lines 38 and 39. The transistors 46 and 47 are controlled by Y-select information on node 48, which comes from a 1-of-16 decoder 49 receiving the 4-bit column address on lines 25. A transistor 50 also is controlled by the Y-select on node 48; this transistor 50 is in series with an inverter transistor which has a P-channel precharge and load circuit. In the single-ended read operation, the inverter functions to place on node 51 the complement of the data bit on node 52, when the buffer 24-1-1 is selected (due to node 48 being high and transistor 50 being on), so that data bit from the selected sense amp is coupled from node 51, through transistor 47, line 39, to node 59 of the buffer 22-1. Transistor 46 and line 38 have no function during read operations. When node 52 is low, P-channel transistor 53 is on and node 51 is held at the supply voltage Vdd. Likewise, when node 51 is low, P-channel transistor 54 is held on and node 52 is held high. Both nodes 51 and 52 are precharged high by P-channel transistors 55 which receive a low-going precharge voltage L (generated by the circuitry 31) in the precharge cycle after $\overline{RAS}$ goes high.

The buffer 22-1 in FIG. 4 is controlled by Y-select information from address bits on lines 23 and a 2-of-16 decoder 56, so if this buffer is selected a node 57 is high. This condition turns on a transistor 58 and allows the data on line 39 or node 59 to be amplified through three stages 60, 61 and 62 for driving a node 63. For read, a complementary transistor pair 64 is on, due to a read command R from control circuitry 31 applied to NAND gate 65. That is, when R/$\overline{W}$ is high, defining a read operation, then R is high and transistors 64 are both on. At this time, complementary transistor pairs 66 and 67 are off because write control W is low. Thus, the data bit on line 39 controls the line 16 through node 59, cascaded inverters 60, 61 and 62, node 63 and transistors 64, for a read operation. On the other hand, for a write operation, the transistor pairs 66 and 67 will be on, and transistor pair 64 will be off, so node 59 (and line 39)

will receive the data bit from line 16 through transistors 67, and node 63 (and line 38) will receive the complement of this bit, thus converting from single-rail (on line 16) to double-rail (on lines 38, 39) during write. From the lines 38,39, the dual-rail write data is coupled through both transistors 46 and 47, then through a selected transistor pair 43,44, to one of the sense amps 26.

Figure 5:
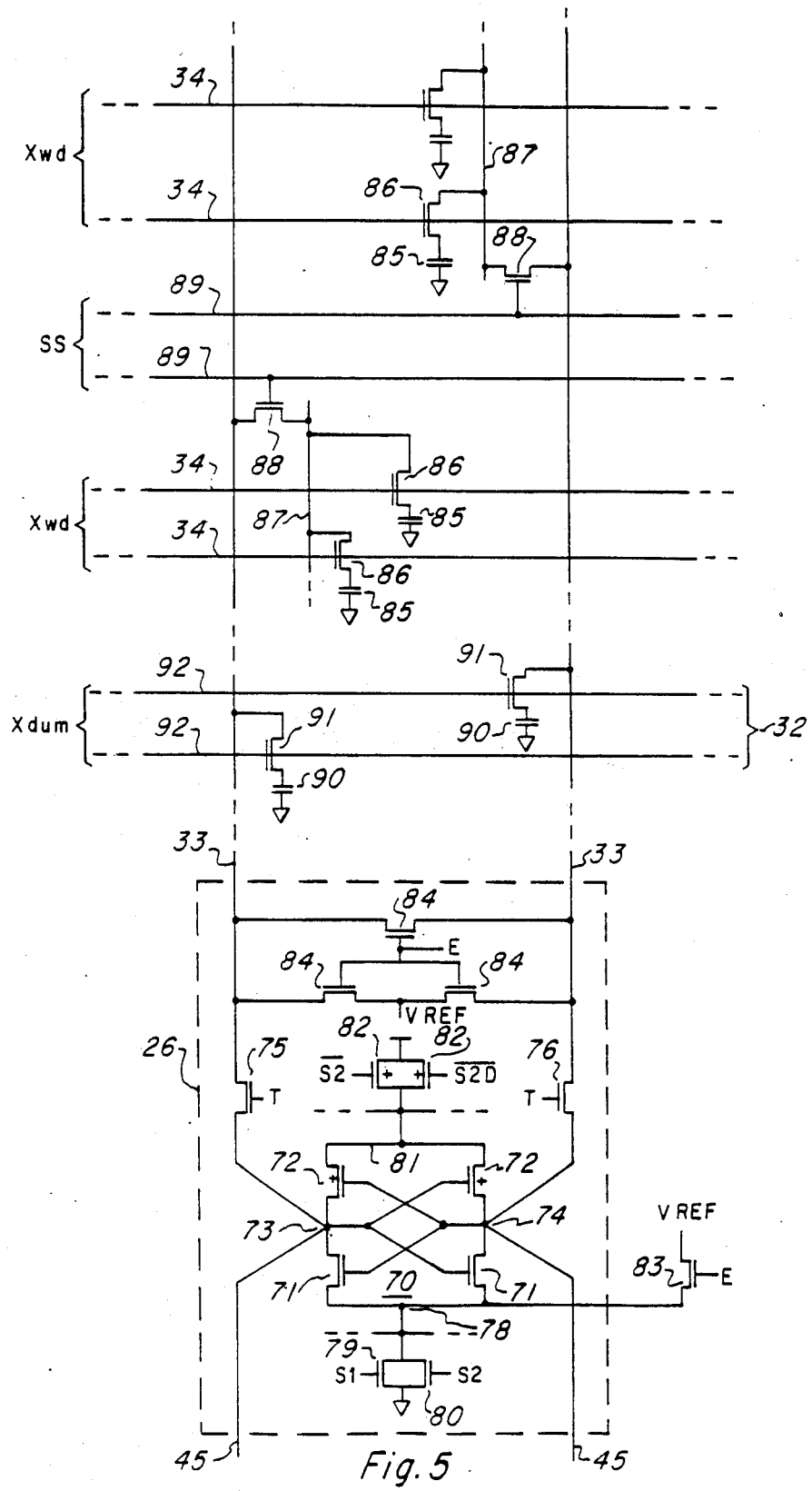
FIG. 5 is an electrical diagram in schematic form of the sense amplifier and cell array of FIGS. 1-4.

Referring to FIG. 5, one of the sense amplifiers 26 is shown in detail. This Figure also shows the two bit lines 33 for this sense amplifier and four of the 512 row lines 34 perpendicular to these bit lines. The sense amplifier employs a CMOS cross-coupled flip-flop 70 having N-channel driver transistors 71 and P-channel transistors 72. Sense nodes 73 and 74 are connected to bit lines 33 through the source-drain paths of isolating transistors 75 and 76, as explained in copending application Ser. Nos. 636,938 or 636,939, filed Aug. 2, 1984, by Duvvury and Hyslop, assigned to Texas Instruments. A node 78 on the ground side of the flip-flop 70 is coupled to ground through two N-channel transistors 79 and 80 which have sense clocks S1 and S2 on their gates. The transistor 79 is much smaller than the transistor 80, and clock S1 occurs first, so the initial sensing is at a lower-gain condition, and is performed by N-channel transistors 71. On the Vdd side, a node 81 is coupled to the supply through P-channel transistors 82, one of which has sense clock $\overline{S2}$ on its gate and the other a delayed $\overline{S2D}$ on its gate. The sense clock $\overline{S2}$ is the complement of S2, so the P-channel transistor 72 starts to operate only when the second clock S2 is activated. There is a two-interval sense operation, first S1, then S2 and $\overline{S2}$. The transistor pairs 79,80 and the transistors 82, are shared with all of the other sense amplifiers 26 in two blocks 10a and 10b, i.e., 1024 sense amplifiers. The node 78 is precharged to about one-half Vdd by a transistor 83 when E is high.

The bit lines 33 are precharged and equalized through three transistors 84 which have an equalize clock voltage E on their gates; two of these transistors 84 have their sources connected to a reference voltage Vref. The value of this reference voltage is about half Vdd, so little or no net charge is needed from the chip supply Vdd to precharge all of the bit lines. This is, one line 33 will be high and the other low for each sense amplifier, so one will charge the other, and Vref need only supply any differential that might have occurred. The clock E is generated in the control circuitry 31 after the end of an active cycle, when $\overline{RAS}$ goes high.

Each of the memory cells consists of a capacitor 85 and an access transistor 86, with the gates of all of the 512 access transistors 86 in a row being connected to a row line 34. Only one row line 34 of the 512 in the block is turned on at any one time, so only one memory cell capacitor 85 is connected to a bit line 33 for a given sense amplifier 26. According to the invention of application Ser. No. 634,898, filed July 26, 1984, by David J. McElroy, assigned to Texas Instruments, in order to reduce the ratio of the bit line capacitance to the value of the storage capacitance 85, a number of bit line segments 87 are employed for each pair of bit lines 33. Only one of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier (16×32=512). The row decoder 11a or 11b selects the appropriate one of sixteen lines 89 by a segment select voltage SS when this decoder selects 1-of-512 row lines 34, based on certain ones of the same nine address bits from lines 14.

In the dummy rows 32, a pair of dummy cells are provided for each pair of bit lines 33, and these dummy cells consist of dummy capacitors 90 and access transistors 91. When the selected storage cell is on the left-hand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Figure 6:
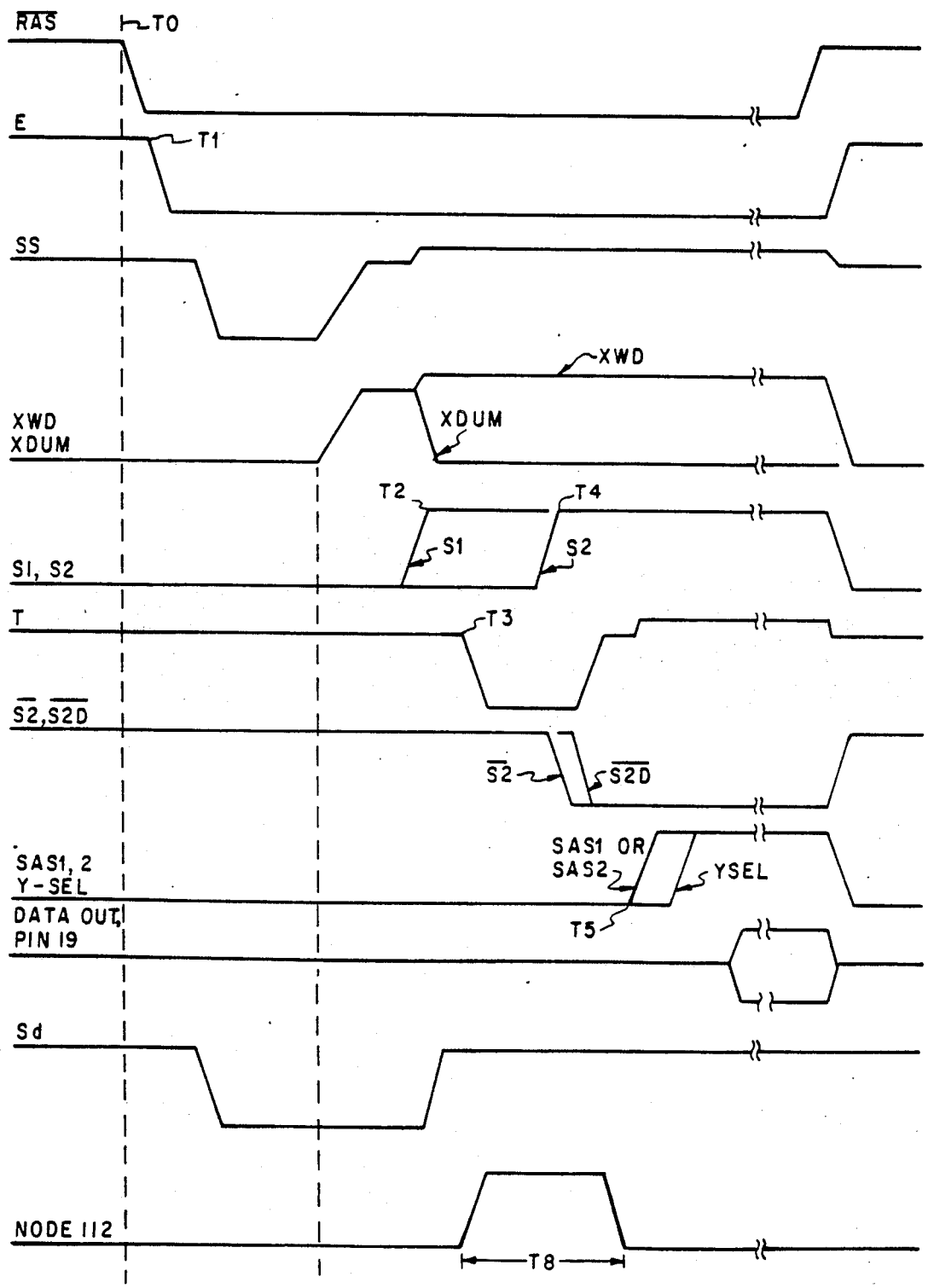
FIG. 6 is a timing diagram showing voltage vs. time for various nodes in the circuit of FIGS. 1-5.

Referring to FIG. 6, the sequence of operation of the memory device will be explained. An active cycle begins with the RAS voltage dropping from +5 to zero at the time T0. This example is a read cycle, so at time T0 the R/W input voltage is at +5. The time prior to T0 is a precharge cycle, during which the equalize voltage E has been high, so all of the bit lines 33 and the nodes 78, have been precharged to the Vref voltage, assumed to be about ½ Vdd or +2.5. The segment select voltage SS on all lines 89 is also held high during the precharge cycle, so all of the segments 87 are also precharged to the Vref voltage. The dropping of $\overline{RAS}$ at T0 causes the equalize voltage E to drop at T1, isolating the pairs of bit lines 33 from each other and from Vref. The segment select voltage SS then drops, isolating all of the segments 87 from the bit lines 33. As soon as the row decoders 11a, 11b have had time to respond to the row address, the Xwd and Xdum voltages start to rise on the selected 1-of-512 row line 34 and selected 1-of-2 dummy line 92; at the same time, the segment-select voltage on one of the lines 89 is brought up. These address voltages Xwd, Xdum and SS are brought up rather slowly, and after reaching the Vdd level, SS and Xwd are boosted above Vdd to eliminate the Vt drop across the access transistors 86 and 88. The Xdum voltage falls, since the function of the dummy cells is completed during initial sensing, and the dummy capacitors can be decoupled from the bit lines so precharge can begin, as will be explained. At time T2, the sense amplifiers 26 are first activated by the S1 voltage going high, turning on the high-impendence N-channel transistor 79; this begins to separate the bit lines 33 further than the separation caused by the differential voltages on the storage cell and dummy cell. But before any current flows from the supply Vdd through transistors 72, the T voltage falls at T3, isolating the bit lines 33 from the sense nodes 73 and 74. After the T voltage falls, the sense voltage S2 is brought up, so the large transistor 80 begins to conduct; also $\overline{S2}$ drops, so one P-channel load transistor 82 begins to conduct. After a slight delay $\overline{S2D}$ falls, and the other P-channel transistor 82 begins to conduct. After S2 rises and $\overline{S2}$ drops at T4, the T voltage is brought up to Vdd. At time T5 after the isolating transistors 75, 76 have been turned back on, sensing is complete and one bit line 33 is high and the other at zero, so the sense-amp-select voltage SAS1 or SAS2 is turned on, connecting one of the bit lines to the node 52 via lines 45 and 37 of FIG. 4. Just after this the Ysel-1 and Ysel-2 outputs from decoders 49 and 56 are valid at nodes 48 and 57, so the selected data bit becomes valid on the line 16, and shortly thereafter valid on the output pin 19.

If the column address changes, the SAS1, SAS2, Ysel-1, Ysel-2 voltages will change to produce a new data output bit. The row address stays the same, and the data selected at the initial $\overline{RAS}$ in this cycle is latched in all the sense amplifiers at nodes 73,74. Thus, nothing in FIG. 6 changes prior to T5. The column access time for static column decode is thus very rapid.

Figure 7:
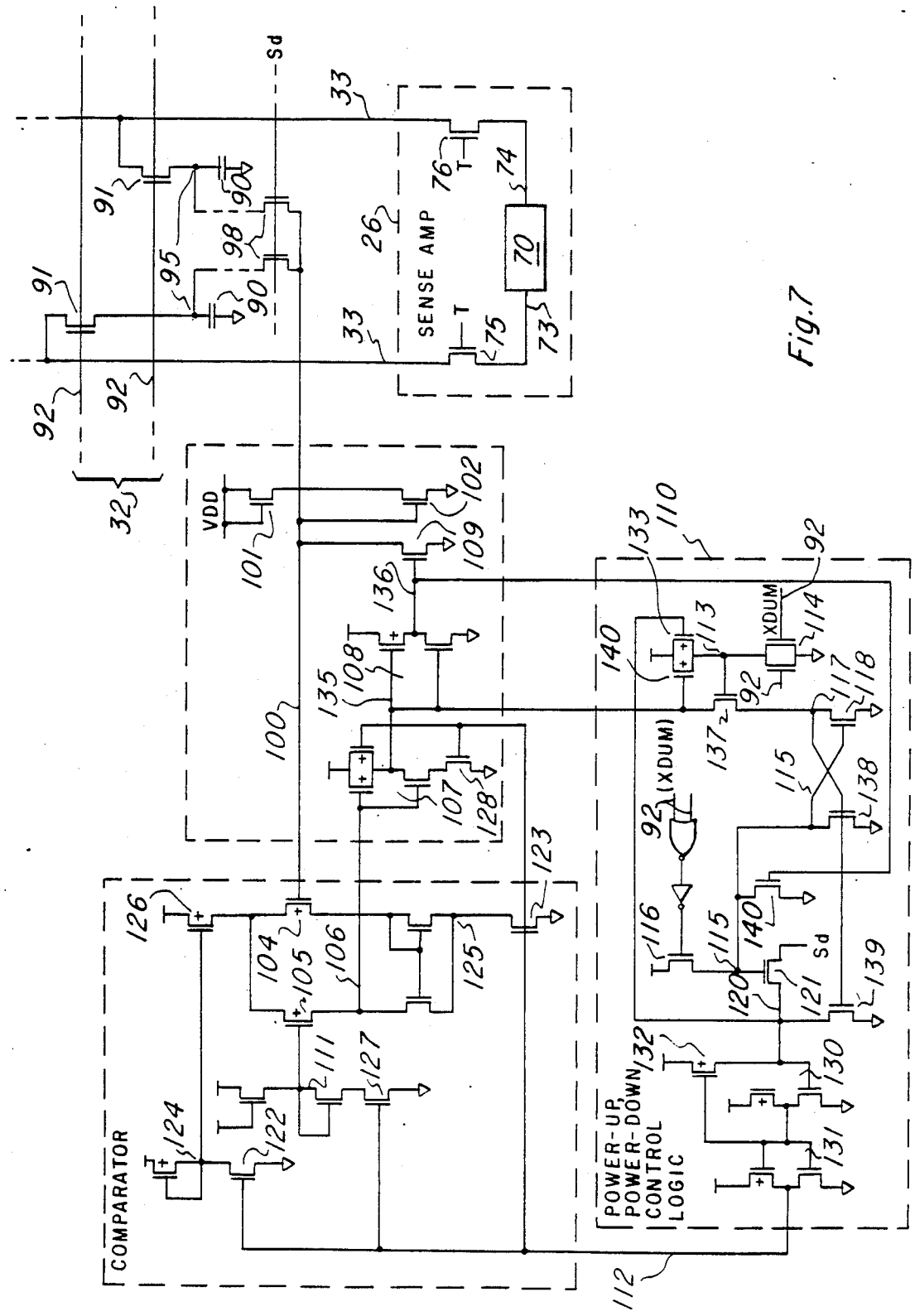
FIG. 7 is an electrical schematic diagram of the dummy cell precharging circuitry in the device of FIGS. 1-5, according to the invention.

Turning now to FIG. 7, a circuit for generating the dummy cell reference voltage on the nodes 95 of the dummy cell capacitors 90 according to the invention is illustrated. The purpose of this circuit is to produce a voltage on the dummy cell capacitors 90 which will result in a voltage on the bit lines 33 which is about half way between that produced by a 1 and a 0 stored in the selected memory cell capacitor 85, but nevertheless allowing a physical layout size of the dummy cell capacitors 90 to be equal to that of the storage cell capacitors 85. To this end, all of the dummy cell capacitors 90 are connected through transistors 98 to a dummy cell reference voltage node 100. The gates of transistors 98 are connected to an Sd clock voltage which goes high after Xdum goes low as seen in FIG. 6; Sd goes low before Xdum and Xwd go high, so the reference voltage is trapped on capacitors 90 before the sensing cycle starts. The reference voltage on node 100 is produced by the ratio of the size of a pair of transistors 101 and 102 connected between Vdd and Vss, with the node 100 being at a midpoint. This reference voltage is selected to be nominally at about +1.1 volts. The value is selected to be between a minimum 1 level, which is +1.5 V, and a maximum 0 level, which is +0.7 V.

When Sd goes high, this couples 2048 dummy capacitors 90 to the node 100, and the average voltage of these dummy capacitors 90 is about +2.5 v. This must be reduced to the reference value of about +1.1 before the next cycle. To avoid static power dissipation, the transistors 101 and 102 are of small size, so it would take too long to dissipate the charge to Vss through transistor 102. Accordingly, another path is provided to discharge this voltage differential.

A comparator circuit 103 in FIG. 7 detects the voltage on the node 100 at the gate of P-channel transistor 104 and compares it with a reference on the gate of P-channel transistor 105, to produce a change in output on node 106 when the node 100 is too high or too low. The node 106 is an input to a two stage driver circuit including CMOS inverters 107 and 108, to accelerate the discharge of the voltage on the node 100 through a control transistor 109 during the initial period when the reference voltage is too high.

A power-up/power-down control circuit 110 is coupled to the control node 112 for the comparator 103 and the invertor 107, and in response to the clocks Xdum and Sd, produces a control voltage at this node 112 to limit the operation of the comparator 103 and driver 107 to only the necessary time, to thus save power.

The comparator 103 compares the voltage on the node 100 with the output of a voltage divider 111, using differential inputs to the gates of the two P-channel transistors 104 and 105. The voltage divider 111 is formed by series transistors like the divider 101,102. To prevent static current drain in the comparator 103 and divider 111, transistors in series with these devices are controlled by the node 112.

When the Xdum voltage on the selected one of the lines 92 goes low, the dummy cell precharge cycle starts by driving clock Sd high. The condition of the control circuit 110 of FIG. 7 at this point had been defined when Xdum on one of the two lines 92 went high, which functioned to ground node 113 by one of the transistors 114. Also, node 115 was forced to a value of Vdd−Vt by transistor 116 which had Xdum applied to its gate through two delay stages. Node 117 is thus grounded by transistor 118 which has its gate cross-coupled to node 115. Node 120 has also been discharged at this point (actively pulled down by clock Sd through transistor 121). So, when clock Sd goes high, the node 115 will be booted higher than Vdd, resulting in a full Vdd level transfer to nodes 120 and 112. When node 112 goes high (after Sd goes high) the comparator 103 is activated by transistors 122 and 123 which provide a path to ground for nodes 124 and 125. The node 124 is held high, at (Vdd−Vtp), turning off P-channel transistor 126, until transistor 122 is turned on by control 112. Likewise, transistor 127 in series with the voltage divider 111 is turned on when node 112 goes high, and transistor 128 in series with the inverter 107 is controlled by the node 112. Thus, all of the comparator 103 plus the inverter 107 are completely turned off and draw no current, except during the brief period when control transistor 109 is rapidly discharging the node 100 from 2.5 down to 1.1 volts; this period is seen as time T8 of FIG. 6.

The voltage on control node 112 is determined by the voltage on the node 120, through two CMOS inverters 130 and 131. A P-channel keeper device 132 holds the node 120 high when its gate is low (node 112 high), so the transistor 133 is held in an off condition.

When the node 100 has discharged through the transistor 109 to the proper level, the transistor 104 begins to conduct more and the transistor 105 less in the comparator 103, so the output 106 drops, inverter 107 produces a rising voltage on node 135, which in turn produces lower voltage on the gate 136 of control transistor 109, turning off the transistor 109. This also functions to drive the node 112 low by the operation of the control circuit 110. When node 135 goes high, this voltage will be coupled through the transistor 137 to the node 117, turning on transistor 138 in the latch, thus turning off transistor 118. When node 115 goes low due to transistor 138 conducting, the transistor 121 is turned off and node 120 is pulled low by transistor 139 which has the voltage of node 117 on its gate. This turns on the keeper transistor 133 and holds node 113 high and transistor 137 on. Previously, the keeper transistor 140 had been held on by node 135 being low. The node 113 is thus in a condition to initiate the next cycle. The low voltage on the node 136 turns off the transistor 140, which functioned to hold the node 115 down when the transistor 109 was turned on, thus isolating the Sd voltage from node 120 during the active part of the precharge operation.

Referring again to FIG. 6, the Xdum voltage on a line 92 drops before the full-level of rail-to-rail voltage exists on the bit lines, so the sense amplifier transistors 71 are not allowed to discharge or charge up the dummy cells; this conserves power. The dummy cells are never discharged all the way to ground so the node 100 (when Sd goes high) is always considerably higher than the reference level at 111 of comparator 103.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor memory device comprising:

an array of rows and columns of storage cells, each storage cell having a storage capacitor, at least one row of dummy cells adjacent said array of storage cells, each dummy cell having a dummy capacitor, addressing means for activating one of said rows of storage cells and activating said row of dummy cells at a first time in an operating cycle, a first voltage divider connected between a voltage supply and ground, said first divider having an intermediate node at an intermediate voltage level, said intermediate node being coupled to all of said dummy capacitors at a time prior to said first time in an operating cycle, to thereby precharge all of said dummy capacitors to an intermediate voltage determined by said intermediate voltage level, and said intermediate node being decoupled from said dummy capacitors for a priod after said first time, and a control element connecting said intermediate node to ground in said operating cycle beginning at a second time which is after said period, to thereby pull said intermediate node rapidly down to said intermediate voltage level prior to said first time in the next operating cycle.

2. A device according to claim 1 wherein said addressing means includes means for deactivating said row of dummy cells prior to said second time, while leaving said row of storage cells activated.

3. A device according to claim 1 wherein said storage cells and said dummy cells are one-transistor dynamic memory cells.

4. A device according to claim 1 wherein a second voltage divider is connected between said voltage supply and ground, and including a comparator having a first input coupled to said intermediate node of said first voltage divider and a second input coupled to an intermediate node of said second voltage divider; said comparator having an output coupled to said control element.

5. A device according to claim 4 wherein control means are provided to deactiviate said comparator until said second time in said operating cycle.

6. A device according to claim 1 wherein said reference voltage is a voltage level less than half the magnitude of said supply voltage with respect to ground.

7. A device according to claim 1 wherein said control element is a transistor having a source-to-drain path connected between said intermediate node and ground; and said voltage divider is a pair of transistors having source-to-drain paths, said source-to-drain paths of said pair of transistors being connected in series between said voltage supply and ground.

8. A device according to claim 1 wherein said addressing means includes a row address decoder producing a row address voltage which is high during said sense period and a dummy cell address voltage which is high only during an initial part of said sense period.

9. A semiconductor dynamic read/write memory device comprising:

an array of rows and columns of storage cells, each storage cell having a storage capacitor, storage cells of a column being coupled to a bit line by access transistors, at least one row of dummy cells adjacent said array of storage cells each dummy cell having a dummy capacitor, dummy cell access means for coupling a dummy cell to each bit line, a differential sense amplifier for each column coupled to the bit lines, addressing means for activating the access transistors of one of said rows of storage cells and activating said access means of a row of dummy cells at a first time in an operating cycle, means for activating said sense amplifiers for a sense period beginning at about said first time in an operating cycle, a voltage divider connected between a voltage supply and ground, said voltage divider having an intermediate node coupled to all of said dummy capacitors at a time prior to said first time in and operating cycle, to thereby precharge all of said dummy capacitors to a reference voltage, means for decoupling said voltage divider from said dummy capacitors during said sense period, and a control element connecting said intermediate node of the voltage divider to a reference potential for a period of time in said operating cycle beginning at a second time in said operating cycle after said sense period, to thereby pull said intermediate node down toward said reference voltage level prior to said first time in the next operating cycle.

10. A device according to claim 9 wherein said addressing means includes means for deactivating said row of dummy cells prior to said second time, while leaving said row of storage cells activated.

11. A device according to claim 9 wherein said storage cells and said dummy cells are one-transistor dynamic memory cells.

12. A device according to claim 9 wherein a second voltage divider is connected between said voltage supply and ground, and including a comparator having a first input coupled to said midpoint of said first voltage divider and a second input coupled to a midpoint of said second voltage divider; said comparator having an output coupled to said control element.

13. A device according to claim 12 wherein control means are provided to deactivate said comparator until said second time in said operating cycle.

14. A device according to claim 9 wherein said reference voltage is a voltage level less than half the magnitude of said supply voltage with respect to ground.

15. A device according to claim 9 wherein said control element is a transistor connected between said midpoint and ground; and said voltage divider is a pair of transistors having source-to-drain paths connected in series.

16. A method of precharging a plurality of dummy cell capacitors to a selected voltage in a dynamic read/write memory cell array, comprising the steps of:

isolating all of the dummy cell capacitors from bit lines of the array during a precharge period while coupling all of said dummy cell capacitors to an intermediate node of a voltage divider whereby the voltage on said dummy cell capacitors is at said selected voltage at the end of said precharge period, coupling selected dummy cell capacitors to bit lines during an initial sensing period, and detecting the voltage on the bit lines by differential sense amplifiers, isolating said dummy cell capacitors from said bit lines after said initial sensing period and then activating the sense amplifiers at a higher level during a continued sensing period to separate the voltages in the bit lines to a full logic level, again coupling said dummy cell capacitors to said intermediate node of the voltage divider beginning during said continued sensing period, and pulling said intermediate node down to said selected voltage prior to the end of said precharge period for the next operating cycle.

17. A method of precharging a plurality of dummy cell capacitors to a selected voltage in a dynamic read/write memory cell array, comprising the steps of:

isolating all of the dummy cell capacitors from bit lines of the array during a precharge period while coupling all of said dummy cell capacitors to an intermediate node of a voltage divider whereby the voltage on said dummy cell capacitors is at said selected voltage at the end of said precharge period, coupling selected dummy cell capacitors to bit lines during an initial sensing period, and detecting the voltage on the bit lines by differential sense amplifiers, isolating said dummy cell capacitors from said bit lines after said initial sensing period and then activating the sense amplifiers at a higher level during a continued sensing period to separate the voltages in the bit lines to a full logic level, again coupling said dummy cell capacitors to said intermediate node of the voltage divider beginning during said continued sensing period.

18. A method according to claim 17 including the step of shutting off said controlled current path during said precharge period to thereby save power.

* * * * *